US012174237B2

United States Patent
Krishnamoorthy et al.

(10) Patent No.: US 12,174,237 B2
(45) Date of Patent: Dec. 24, 2024

(54) ONBOARD CIRCUITS AND METHODS TO PREDICT THE HEALTH OF CRITICAL ELEMENTS

(71) Applicants: University of Houston System, Houston, TX (US); The United States of America, as represented by the Secretary of the Navy, Arlington, VA (US)

(72) Inventors: Harish Krishnamoorthy, Missouri City, TX (US); Joshua Hawke, Bloomington, IN (US)

(73) Assignees: University of Houston System, Houston, TX (US); The United States of America, as represented by the Secretary of the Navy, Arlington, VA (US)

( * ) Notice: Subject to any disclaimer, the term of this patent is extended or adjusted under 35 U.S.C. 154(b) by 0 days.

(21) Appl. No.: 17/961,854

(22) Filed: Oct. 7, 2022

(65) Prior Publication Data

US 2023/0110695 A1  Apr. 13, 2023

Related U.S. Application Data

(60) Provisional application No. 63/253,691, filed on Oct. 8, 2021.

(51) Int. Cl.
*G01R 31/26* (2020.01)
*G01R 31/28* (2006.01)
*G01R 31/64* (2020.01)

(52) U.S. Cl.
CPC ..... *G01R 31/2621* (2013.01); *G01R 31/2834* (2013.01); *G01R 31/2837* (2013.01);
(Continued)

(58) Field of Classification Search
CPC .... G01R 31/40; G01R 31/64; G01R 31/2821; G01R 31/2834; G01R 31/2837; G01R 31/2844; G01R 31/2846
See application file for complete search history.

(56) References Cited

U.S. PATENT DOCUMENTS 5,363,049 A * 11/1994 Bullock ............... G01R 31/08
324/520
7,847,562 B2 * 12/2010 Montgomery ......... G01R 27/16
361/45

(Continued)

FOREIGN PATENT DOCUMENTS

FR  3054885  2/2018

OTHER PUBLICATIONS

Wang et al., "Design for Reliability of Power Electronic Systems", IEEE, 2012, 12 pages.

(Continued)

*Primary Examiner* — Thang X Le
(74) *Attorney, Agent, or Firm* — Jackson Walker LLP; Christopher J. Rourk

(57) ABSTRACT

A system for monitoring a circuit, comprising a device under test, such as a power field effect transistor or capacitor, coupled to a power source and a signal source and configured to generate a power output using the signal source, a current output, a voltage output and an end of life detector coupled to the current output and the voltage output and configured to generate a first impedance as a function of the current output and the voltage output, to compare the first impedance to a second impedance and to generate an indicator if the first impedance exceeds the second impedance.

20 Claims, 6 Drawing Sheets

(52) U.S. Cl.
CPC ..... *G01R 31/2844* (2013.01); *G01R 31/2846* (2013.01); *G01R 31/64* (2020.01)

(56) References Cited

U.S. PATENT DOCUMENTS

| | | | |
|---|---|---|---|
| 10,609,482 B2 * | 3/2020 | Goto | H04R 29/001 |
| 10,908,202 B1 * | 2/2021 | Jia | H02J 3/0012 |
| 2014/0103937 A1 | 4/2014 | Khan et al. | |
| 2014/0218042 A1 * | 8/2014 | Koba | G01R 31/367 324/430 |
| 2015/0092460 A1 * | 4/2015 | Tallam | H02M 5/4585 363/44 |
| 2016/0069963 A1 * | 3/2016 | Hebiguchi | G01R 31/389 324/430 |
| 2017/0117813 A1 | 4/2017 | Lee | |
| 2017/0160338 A1 | 6/2017 | Connor et al. | |
| 2020/0319263 A1 * | 10/2020 | Kato | G01R 31/64 |
| 2021/0048478 A1 * | 2/2021 | Danesh | H01H 1/0015 |
| 2022/0006333 A1 * | 1/2022 | Yeo | H02J 50/80 |
| 2022/0263314 A1 * | 8/2022 | Sharpe | H02J 3/007 |

OTHER PUBLICATIONS

Wang, et al., "Transitioning to Physics-of-Failure as a Reliability Driver in Power Electronics", IEEE Journal of Emerging and Selected Topics in Power Electronics, vol. 2, No. 1, Mar. 2014, 18 pages.
Yang, et al., "An Industry-Based Survey of Reliability in Power Electronic Converters", IEEE, 2009, 7 pages.
Biglarbegian, et al., "On Condition Monitoring of High Frequency Power GaN Converters with Adaptive Prognostics", IEEE, 2018, 8 pages.
Erturk, et al., "Real-Time Aging Detection of SiC MOSFETs", IEEE Transactions on Industry Applications, vol. 55, No. 1, Jan./Feb. 2019, 10 pages.
Medjaher, et al., "Remaining Useful Life Estimation of Critical Components With Application to Bearings", IEEE Transactions on Reliability, vol. 61, No. 2, Jun. 2012, 11 pages.
Gupta, et al., "A Review of Degradation Behavior and Modeling of Capacitors", (Reprint) North Dakota State University, National Renewable Energy Laboratory, Conference Paper NREL/CP-5400-71386, Oct. 2018, 13 pages.
Amaral, "An Experimental Technique for Estimating the ESR and Reactance Intrinsic Values of Aluminum Electrolytic Capacitors", IEEE, 2006, 6 pages.
Laadjal, et al., "Online Estimation of Aluminum Electrolytic-Capacitor Parameters Using a Modified Prony's Method", IEEE Transactions on Industry Applications, vol. 54, No. 5, Sep./Oct. 2018, 11 pages.
Ren, et al., "An Online ESR Estimation Method for Output Capacitor of Boost Converter", IEEE Transactions on Power Electronics, vol. 34, No. 10, Oct. 2019, 13 pages.
Beczkowski, et al., "Online Vce Measurement Method for Wear-Out Monitoring of High Power IGBT Modules", Proceedings of the 15th European Conference on Power Electronics and Applications, EPE 2013, 7 pages.

Dusmez, et al., "Remaining Useful Lifetime Estimation for Thermally Stressed Power MOSFETs Based on ON-State Resistance Variation", IEEE Transactions on Industry Applications, vol. 52, No. 3, May/Jun. 2016, 10 pages.
Levenberg, et al., "A Method for the Solution of Certain Non-Linear Problems in Least Squares", Quarterly of Applied Mathematics, vol. 2, No. 2, Jul. 1944, pp. 164-168.
Erickson, "Steady-State Equivalent Circuit Modeling, Losses, and Efficiency", Fundamentals of Power Electronics: Second Edition, 2000, pp. 39-41.
Middlebrook, et al., "A General Unified Approach to Modeling Switching-Converter Power Stages", 1976 IEEE Power Electronics Specialists Conference, 1976, pp. 18-34.
Van Dijk, et al., PWM-Switch Modeling of DC-DC Converters, IEEE Transactions on Power Electronics, vol. 10, No. 6, Nov. 1995, 7 pages.
Yang, et al., "Condition Monitoring for Device Reliability in Power Electronic Converters: A Review", IEEE Transactions on Power Electronics, vol. 25, No. 11, Nov. 2010, 19 pages.
Vazquez, et al., "Model Predictive Control: A Review of Its Applications in Power Electronics", IEEE Industrial Electronics Magazine, Mar. 19, 2014, 16 pages.
Schluse, et al., "Experimentable Digital Twins—Streamlining Simulation-Based Systems Engineering for Industry 4.0", IEEE Transactions on Industrial Informatics, vol. 14, No. 4, Apr. 2018, 10 pages.
Peyghami, et al., "A Guideline for Reliability Prediction in Power Electronic Converters", IEEE Transactions on Power Electronics, vol. 35, No., 10, Oct. 2020, 11 pages.
Zhang, et al., "Mission Profile-Based System-Level Reliability Prediction Method for Modular Multilevel Converters", IEEE Transactions on Power Electronics, vol. 35, No. 7, Jul. 2020, 15 pages.
Ma, et al., "Prediction and Validation of Wear-Out Reliability Metrics for Power Semiconductor Devices with Mission Profiles in Motor Drive Application", IEEE Transactions on Power Electronics, vol. 33, No. 11, Nov. 2018, 11 pages.
Notification of the International Preliminary Report on Patentability mailed Apr. 18, 2024 for PCT/US22/46036, containing the Written Opinion of the International Search Authority—The European Patent Office, 8 pages.
International Search Report and The Written Opinion of the International Search Authority—The European Patent Office—mailed Dec. 7, 2023, for PCT/US22/46024, 14 pages.
Sadat, et al., "Measure Theory-based Approach for Remaining Useful Lifetime Prediction in Power Converters", IEEE, 2020, pp. 2541-2547.
Magnien, et al., "Temperature Sensitive Electrical Parameter Sensing Unit", IEEE/Therminic, 2019, pp. 1-5.
International Search Report and The Written Opinion of the International Search Authority—The European Patent Office—mailed Oct. 27, 2023, for PCT/US22/46036, 12 pages.
Notification of the International Preliminary Report on Patentability mailed Apr. 18, 2024 for PCT/US22/46024, containing the Written Opinion of the International Search Authority—The European Patent Office, 9 pages.

\* cited by examiner

ONBOARD CIRCUITS AND METHODS TO PREDICT THE HEALTH OF CRITICAL ELEMENTS

RELATED APPLICATIONS

This application claims benefit of and priority to U.S. provisional patent application 63/253,691, filed Oct. 8, 2021, which is hereby incorporated by reference for all purposes as if set forth herein in its entirety.

STATEMENT OF GOVERNMENT RIGHTS

This invention was made in the performance of a Cooperative Research and Development Agreement with the Naval Surface Warfare Center, Crane Division (NCRADA-NSWCCD-18-292). The Government of the United States has certain rights in the invention pursuant to Contract No. W52P1J-20-9-3005 between the Department of the Navy and the University of Houston-Cullen College of Engineering.

BACKGROUND

This disclosure pertains to systems and methods for onboard circuits and methods to predict the health of critical elements.

SUMMARY

A system for monitoring a circuit is disclosed that includes a device under test, such as a power field effect transistor (FET) or capacitor, coupled to a power source and a signal source and configured to generate a power output using the signal source. A current output and a voltage output are provided to an end of life detector that is configured to generate a first impedance as a function of the current output and the voltage output, to compare the first impedance to a second impedance and to generate an indicator if the first impedance exceeds the second impedance.

Other systems, methods, features, and advantages of the present disclosure will be or become apparent to one with skill in the art upon examination of the following drawings and detailed description. It is intended that all such additional systems, methods, features, and advantages be included within this description, be within the scope of the present disclosure, and be protected by the accompanying claims.

BRIEF DESCRIPTION OF THE DRAWINGS

Aspects of the disclosure can be better understood with reference to the following drawings. The components in the drawings may be to scale, but emphasis is placed upon clearly illustrating the principles of the present disclosure. Moreover, in the drawings, like reference numerals designate corresponding parts throughout the several views, and in which.

DETAILED DESCRIPTION OF PREFERRED EMBODIMENTS

Figure 1:
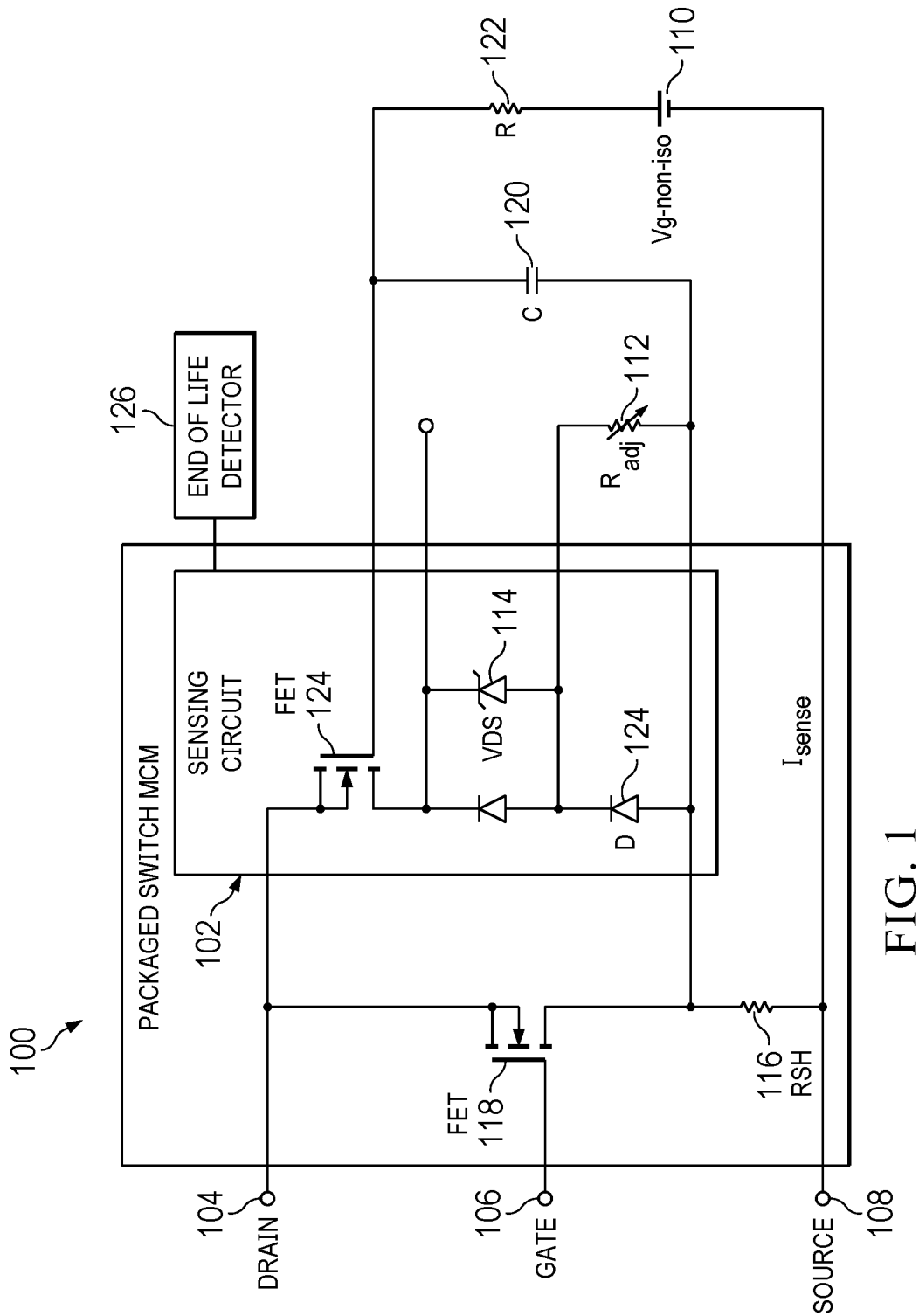
FIG. 1 is a diagram of a circuit that incorporates a sensor for detecting the RUL of a circuit element, in accordance with an example embodiment of the present disclosure.

In the description that follows, like parts are marked throughout the specification and drawings with the same reference numerals. The drawing figures may be to scale and certain components can be shown in generalized or schematic form and identified by commercial designations in the interest of clarity and conciseness.

Onboard circuits and sensors can be used to predict the health of critical elements. In one example embodiment, on-state resistance ($R_{ds\text{-}on}$) is widely accepted as a realistic health indicator for the degradation of power field-effect transistors (FETs), which can be implemented in silicon (Si), silicon carbide (SiC), gallium nitride (GaN) or other suitable materials.

Variations in $R_{ds\text{-}on}$ for several thermal cycles with multiple thermal limits for field effect transistors (FETs) have been observed to form consistent clusters when stressed with the same temperature peaks, with degradation occurring faster at junction temperatures around 200° C. However, at different mission profiles, it is difficult to separate the effects of junction temperature variation with that of the aging process, and different ambient temperature environments may also be seen by the expected range of commercial applications. Moreover, while the $R_{ds\text{-}on}$ steadily increases with aging in Si and SiC FETs across temperature, it doesn't rise consistently in GaN FETs. The rate of change of $R_{ds\text{-}on}$ with aging tends to be higher near room temperature as well as when operating temperatures are 100° C., see, e.g. Efficient Power Conversion. "EPC eGaN® Device Reliability Testing: Phase 12.", Report—2021, which is hereby incorporated by reference for all purposes as if set forth herein in its entirety.

Based on this understanding, it has been determined that the dynamic value of $R_{ds\text{-}on}$ can be used as a reliable health indicator for GaN FETs. However, reliable in-situ sensing of $R_{ds\text{-}on}$ in wide bandgap (WBG) devices is a major challenge, as it may lead to unwarranted ringing issues and also impact the device characteristics. The present disclosure provides minimally invasive sensing circuits, sensors and methods of use that are heterogeneously integrated with FETs, for onboard implementation.

For capacitors, the capacitance and the effective series resistance (ESR) values are regarded as good health indicators. Different capacitor technologies, such as aluminum electrolytic (AEC) and metalized polypropylene film (MPFC), have different characteristics that should be considered as part of circuits, sensors and methods for minimally invasive sensing circuits. In both AEC and MPFC, capacitance drops with ageing. While the drop is significant for AECs (where a 20% reduction is usually considered to represent the end of useful life or EOL), it is lower for MPFCs (within 5%). Hence, the drop in capacitance is a good indicator for AECs, but not as good for MPFCs.

In contrast, ESR increases with aging for both AECs (with a more exponential response) and MPFCs (with a more linear response). Typically, a 50% to 100% increase in ESR is considered a suitable EOL indicator, and it can be used as a good health indicator. Tantalum capacitors also show a similar behavior, but there are relatively fewer data sets available. Several literature studies have tried to accurately measure the ESR and capacitance values for characterizing the aging process of capacitors. However, these methods are used only for laboratory or development stage qualification since they are too complex for onboard implementation. The complexity in measuring ESR and capacitance accurately onboard can result from AC voltage ripple and current, along with the phase angles of multiple harmonics, which need to be evaluated precisely. The present disclosure provides (within 5%) systems, circuits and methods to monitor and predict the degradation of onboard capacitors and other circuit components that can be used AEC, MPFC, tantalum, ceramic and other suitable capacitors, at different mission profiles of voltage, current temperature and humidity.

The present disclosure is directed to circuits, sensors and methods of use for onboard characterization of power FETs, such as for heterogeneously and/or monolithically integrated packages of SiC and GaN power FETs together with sensing and current measurement circuits, gate drivers and other suitable circuits and devices. The present disclosure can be used for circuits in conjunction with kovar/ceramic/or other relevant packaging, to facilitate the use of power FETs at high operating temperature environments. A single FET version can be extended to half-bridge structures with a bootstrap arrangement for the sensing circuit, to eliminate the need for an isolated power supply. Adjustable resistors in the sensing circuit can be used to optimize the sensing circuit for different voltage levels and to avoid damage. A shunt resistor can also be used to allow current measurements using the integrated system itself.

The disclosed circuits, sensors and methods of use can advantageously reduce integrated multi-component modules (MCMs) stray inductances, and may also reduce the sensing circuits' impact on the power FETs' operation. An auxiliary sensing FET can be used as part of the disclosed circuits, sensors and methods of use that is smaller than the associated power FET, as they will face similar temperatures and voltages as the main power FETs, but will use much lower currents. As such, their on-state resistance can be potentially used for indirect temperature measurements inside the package, considering that typical temperature sensors such as thermistors have large time constants that make them unsuitable for use with WBG FETs. For GaN FETs, processing circuits can be used that capture a number of samples within 10 μs, so that the dynamic $R_{ds-on}$ characteristics can be captured precisely.

For onboard implementation and life assessment of capacitors, it is noted that it is sufficient to measure the impedance of the capacitor at the first two or three dominant AC harmonics and observe the variation at similar environmental conditions, without the need to evaluate capacitance and ESR values separately. It is relatively easier to measure the voltage across and current through the critical capacitor using low-cost sense resistors. If $v_1$, $v_2$, $v_3$ and $i_1$, $i_2$, $i_3$ are the peak AC voltage and current values of the capacitor in operation at three frequencies, $f_1$, $f_2$, $f_3$, respectively, then these terms can be derived by using band-pass filters of appropriate frequencies based on the application. The associated impedance values can be given by equation (1):

$$Z_n = \frac{v_n}{i_n} = \sqrt{\left(ESR_{f_n}^2 + \left(\frac{1}{2\pi \cdot f_n \cdot C_{f_n}} - 2\pi \cdot f_n \cdot ESL_{f_n}\right)^2\right)} \quad (1)$$

Where
N=1, 2, 3, etc.,
ESR is the effective series resistance,
ESL is the effective series inductance, and
C is the capacitance.

It may be possible to omit the influence of ESL at lower frequencies. With operational life, ESR will increase, and C will reduce for most types of capacitors. From equation (1), it can be seen that since both the terms are increasing, consistent increases in the measured Z values can be effectively used as an indirect health indicator. By calculating the peak voltages and currents at different frequencies, corresponding values of Z can be calculated, and variations can be characterized to assess the capacitor's health. It may even be possible to use the impedance value at just one dominant frequency, although additional terms will be useful to assess the variations in C, ESR and ESL separately, in case of any ambiguities or for other suitable purposes, such as to implement a digital twin.

FIG. 1 is a diagram of a circuit 100 that incorporates a sensor for detecting the RUL of a circuit element, in accordance with an example embodiment of the present disclosure. Circuit 100 includes sensing circuit 102, drain 104, gate 106, source 108, $R_{sh}$ 116, FET 118, and end of life detector 126, where sensing circuit 102 further includes FET 124, drain-source voltage output $V_{ds}$ 114, diodes 124, adjustable resistor $R_{adj}$ 112, capacitor 120, non-isolated gate voltage output $V_{g\text{-}non\text{-}iso}$ 110 and resistor 122, each of which can be implemented in Si, SiC, GaN or other suitable materials or components, and which can form part of a packaged switch MCM or other suitable components.

Circuit 100 can be used to detect a health indicator of a device, circuit or system under test, such as the on-state resistance ($R_{ds-on}$) of FETs as shown or other suitable health indicators. The detected data can received at a processor and used to predict the health of the component by algorithmic processing of the data, as discussed and disclosed herein. The data can also be used to generate a probability density function (PDF) of the RUL and for other suitable purposes.

In one example embodiment, data capture can be performed in a heterogeneous or monolithic integrated circuit that includes the FET along with the sensing circuits. The sensing circuit can be different from the example embodiment disclosed herein, which is based on an example circuit suggested by Joint Electron Device Engineering Council (JEDEC) standard JC-70 Wide Bandgap Power Electronic Conversion Semiconductors. By integrating the components, the effects of noise (or EMI) can be reduced, and the impact of the sensing circuit on the operation of the primary FET can be reduced.

Sensing circuit 102 can be implemented in Si, SiC, GaN or other suitable materials, and can be formed by a suitable fabrication process, such as front end of line processing, back end of line processing, using multiple components or in other suitable manners. Sensing circuit 102 is used to detect current and voltage data that can be used by end of life detector 126 to determine whether an incipient component failure is likely to occur or for other suitable processes.

Drain 104 is used to provide a high voltage input to the drain of FET 118 or other suitable components of circuit 100. In one example embodiment, drain 104 can be used to provide a DC power input to circuit 100 for use in generating an amplified power signal, or for other suitable purposes.

Gate 106 is used to provide a signal input to the gate of FET 118 or other suitable components of circuit 100. In one example embodiment, gate 106 can be used to provide a signal power input to circuit 100 for use in generating an amplified power signal, or for other suitable purposes.

Source 108 is used to provide a ground or low voltage input to the source of FET 118 or other suitable components of circuit 100. In one example embodiment, source 108 can be used to provide a DC power input to circuit 100 for use in generating an amplified power signal, or for other suitable purposes.

$R_{sh}$ 116 can be implemented in Si, SiC, GaN or other suitable materials, and can be formed by a suitable fabrication process, such as front end of line processing, back end of line processing, using multiple components or in other suitable manners. $R_{sh}$ 116 can be used to provide a shunt resistance to facilitate current measurements or for other suitable purposes.

FET 118 can be implemented in Si, SiC, GaN or other suitable materials, and can be formed by a suitable fabrication process, such as front end of line processing, back end of line processing, using multiple components or in other suitable manners. FET 118 can be a power FET that is used to amplify a power signal or for other suitable purposes FET 124 can be implemented in Si, SiC, GaN or other suitable materials, and can be formed by a suitable fabrication process, such as front end of line processing, back end of line processing, using multiple components or in other suitable manners. FET 124 can be an auxiliary sensing FET that can be used to provide information associated with the thermal conditions of circuit 100 or other suitable conditions.

Drain-source voltage output $V_{ds}$ 114 is used to provide a drain-source voltage output to end of life detector 126 or other suitable components of circuit 100. In one example embodiment, drain-source voltage output $V_{ds}$ 114 can be used to provide a voltage for use in generating an impedance value, or for other suitable purposes.

Diodes 124 can be implemented in Si, SiC, GaN or other suitable materials, and can be formed by a suitable fabrication process, such as front end of line processing, back end of line processing, using multiple components or in other suitable manners. Diodes 124 can be used to generate signals for processing by end of life detector 126 or for other suitable purposes.

Adjustable resistor $R_{adj}$ 112 can be implemented in Si, SiC, GaN or other suitable materials, and can be formed by a suitable fabrication process, such as front end of line processing, back end of line processing, using multiple components or in other suitable manners. Adjustable resistor $R_{adj}$ 112 can be used to generate signals for processing by end of life detector 126 or for other suitable purposes.

Capacitor 120 can be an AEC capacitor, an MPFC capacitor or other suitable capacitors. Capacitor 120 can be used to generate signals for processing by end of life detector 126 or for other suitable purposes.

Non-isolated gate voltage output $V_{g\text{-}non\text{-}iso}$ 110 and resistor 122 are used to provide a non-isolated gate voltage output to end of life detector 126 or other suitable components of circuit 100. In one example embodiment, non-isolated gate voltage output $V_{g\text{-}non\text{-}iso}$ 110 and resistor 122 can be used to provide a voltage for use in generating an impedance value, or for other suitable purposes.

End of life detector 126 can be implemented in hardware or a suitable combination of hardware and software, and can include one or more algorithms for receiving a voltage from $V_{ds}$ 114, $V_{g\text{-}non\text{-}iso}$ 110, Isense current and other suitable data from circuit 100 and to determine whether the associated impedances that are calculated from the data indicate that a component of circuit 100 is nearing its end of life and should be replaced. In one example embodiment, end of life detector 126 can implement equation (1) disclosed herein or other suitable algorithms, such as using one or more logical devices, a processor having an operating memory and code loaded into the memory that causes it to implement the algorithm, or in other suitable manners. End of life detector 126 can generate an indicator, a data message or other suitable outputs that can provide a notification to an operator, that can be used to derive a notification for an operator or that can be used in other suitable manners.

In another example embodiment, the sensed values can be processed using a neural network, machine learning or other suitable data model to predict a probability of survival (or probability of failure) of the device or system under test at a given time in the future.

Figure 2:
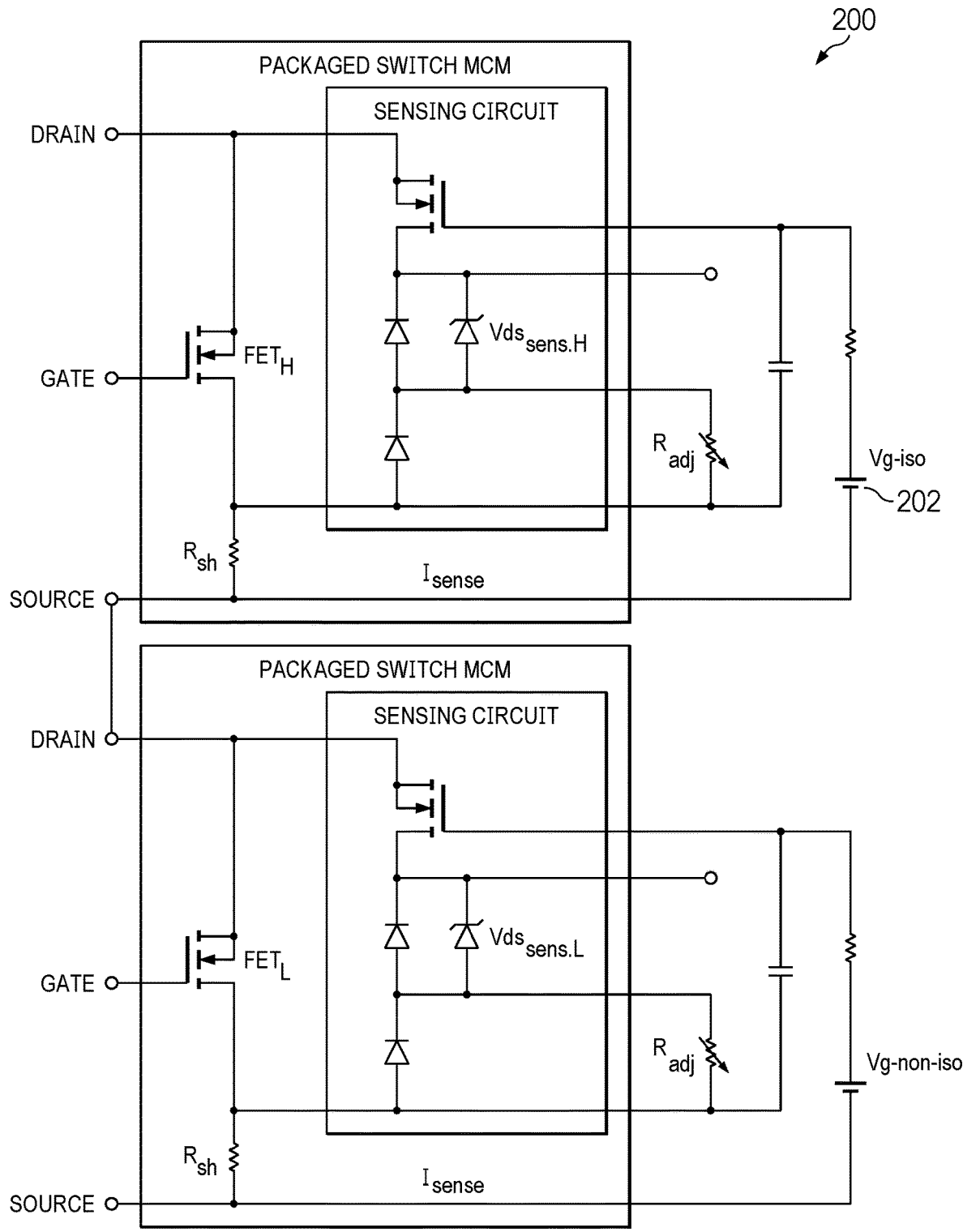
FIG. 2 is a diagram of a circuit that incorporates a sensor for detecting the RUL of a half-bridge FET circuit, in accordance with an example embodiment of the present disclosure.

FIG. 2 is a diagram of a circuit 200 that incorporates a sensor for detecting the RUL of a half-bridge FET circuit, in accordance with an example embodiment of the present disclosure. Circuit 200 includes two power FETs and associated sensing circuits, as discussed in regards to circuit 100, arranged as high and low devices for generating a differential output. In addition, circuit 200 includes isolated voltage output $V_{g\text{-}iso}$ 202, for use in detecting an end of life condition of components in the high side FET of the half-bridge FET circuit shown, but can also or alternatively be used with other suitable circuit structures, such as a structure that includes two or more FETs.

Figure 3:
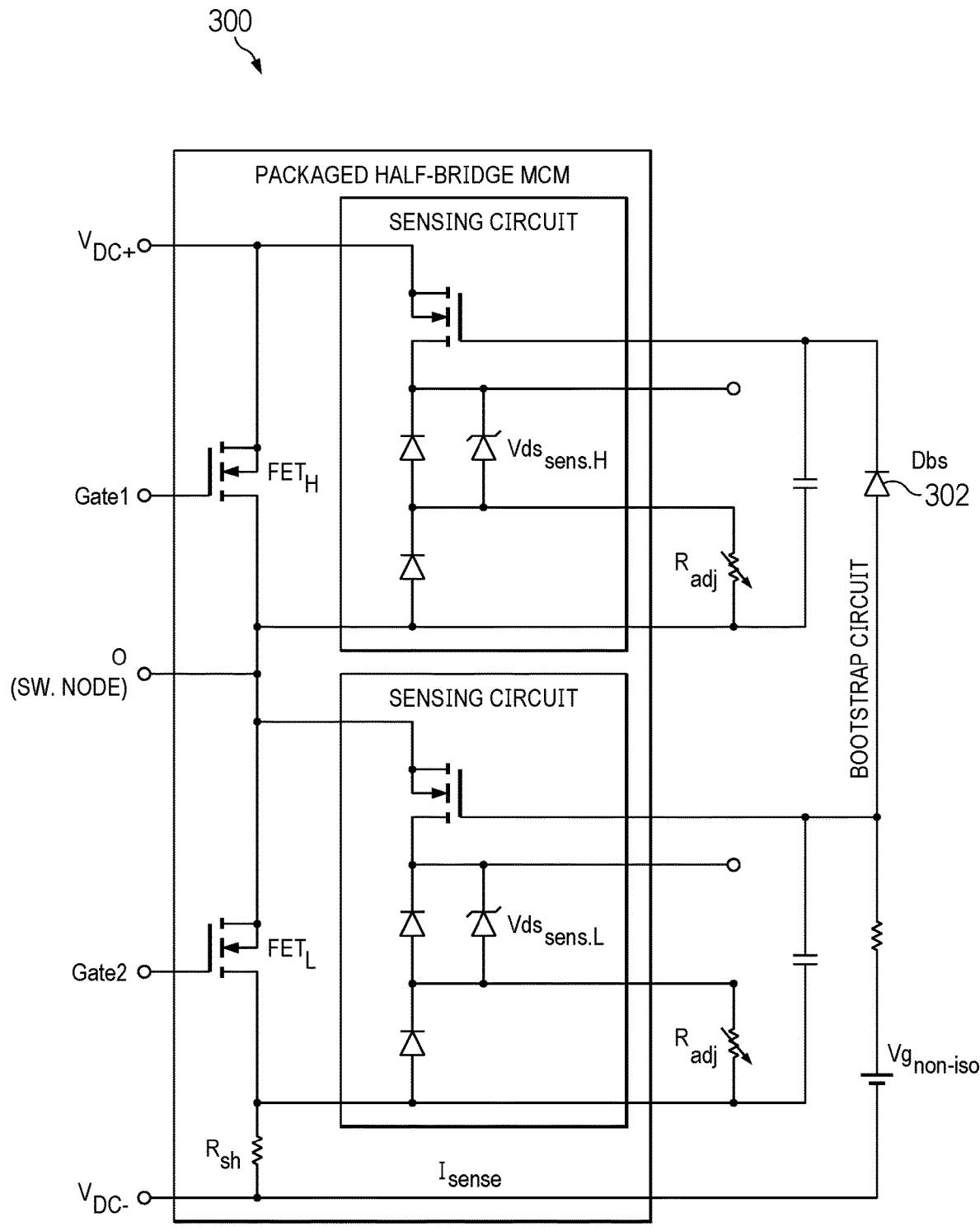
FIG. 3 is a diagram of a circuit that incorporates a sensor for detecting the end of life of a circuit element and a bootstrap circuit, in accordance with an example embodiment of the present disclosure.

FIG. 3 is a diagram of a circuit 300 that incorporates a sensor for detecting the RUL of a circuit element and a bootstrap circuit, in accordance with an example embodiment of the present disclosure. Circuit 300 includes two power FETs and associated sensing circuits, as discussed in regards to circuit 100, arranged as high and low devices for generating a differential output. In addition, circuit 300 includes bootstrap diode Dbs 302, for use in detecting an end of life condition of components in the high side FET.

Figure 4:
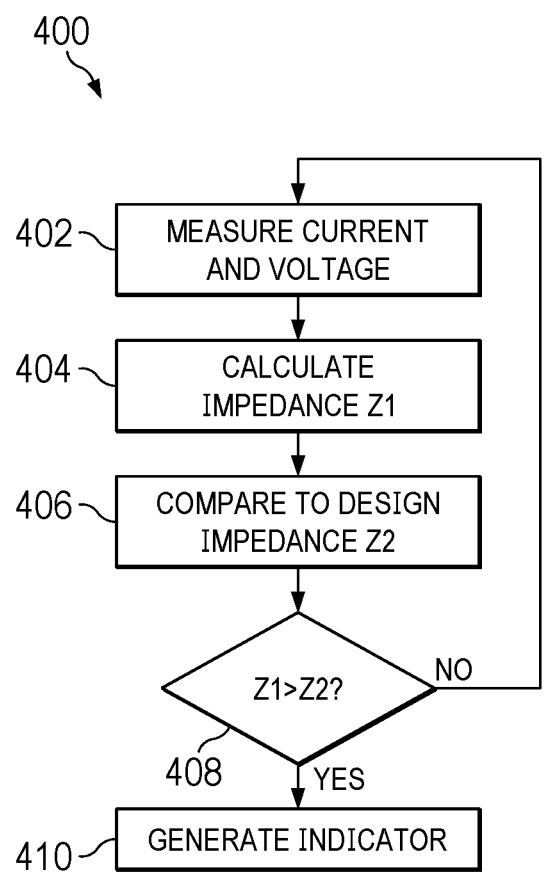
FIG. 4 is an algorithm for using a sensor to detect the end of life of a circuit element, in accordance with an example embodiment of the present disclosure.

The configuration of circuit 300 includes multiple FETs and sensing circuits that can be integrated either heterogeneously or monolithically to provide for monitoring of a 'health indicator' of the circuit. The bootstrap circuit can be used for sensing to reduce the additional requirement of isolated power supplies for top switches, or other suitable configurations can also or alternatively be used. The configuration of circuit 300 is provided as an example, and a person of skill in the art will recognize that other suitable numbers of FETs can be used in the circuit FIG. 4 is an algorithm 400 for using a sensor to detect the RUL of a circuit element, in accordance with an example embodiment of the present disclosure. Algorithm 400 can be implemented in hardware or a suitable combination of hardware and software.

Algorithm 400 begins at 402, where current and voltage data are measured. In one example embodiment, the current and voltage data can be generated by measuring an open circuit voltage, a voltage drop across a resistance or in other suitable manners. An end of life detector system or other suitable systems or components can be used to perform the measurement, which can be a single data point, measurements over a range of frequencies or other suitable measurements. The algorithm then proceeds to 404.

At 404, the impedance Z1 is calculated by dividing a measured voltage by a measured current at a predetermined frequency, at multiple frequencies or in other suitable manners.

In one example embodiment, Z1 can be calculated for each frequency component of a series of frequencies, such as where band pass filters or other suitable processes or components are used to isolate the frequency components. An end of life detector system or other suitable systems or components can be used to perform the calculation. The algorithm then proceeds to 406.

At 406, the measured impedance Z1 is compared to design impedance Z2. In one example embodiment, Z2 can be calculated for each frequency component of a series of frequencies based on a circuit design or in other suitable manners. The calculated values can then be stored in a data memory device for use in periodic evaluation of the status of a circuit, system, component or in other suitable manners. An end of life detector system or other suitable systems or components can be used to perform the comparison. The algorithm then proceeds to 408.

At 408, if it is determined that Z1 greater than Z2, the algorithm proceeds to 410, otherwise the algorithm returns to 402.

At 410, an indicator is generated to alert an operator or other suitable personnel that a circuit, system, component or other element is nearing its end of life and should be serviced or replaced. In one example embodiment, the indicator can be an LED, a digital display or other suitable user interfaces can also or alternatively be used. An availability of a replacement circuit, system, component or other element in inventory can be determined, a replacement circuit, system, component or other element can be automatically ordered or other suitable processes can also or alternatively be used.

In operation, algorithm 400 processes data from a sensor to detect the end of life of a circuit element. Although algorithm 400 is shown as a flow chart, a person of skill in the art will recognize that it can also or alternatively be implemented as a state machine, using object-oriented programming, as a ladder diagram, in other suitable manners or using a suitable combination of implementation processes.

Algorithm 400 is shown using impedances Z1 and Zs, but other suitable variables can also or alternatively be used for RUL PDF estimation. In one example embodiment, a neural network model, a machine learning model or other suitable processing for determining a probability of failure can also or alternatively be used. In addition, while the disclosed embodiments can be used to predict a RUL of individual elements, those values can also or alternatively be used to estimate a probability of survival (or probability of failure) of a system containing those elements.

Figure 5:
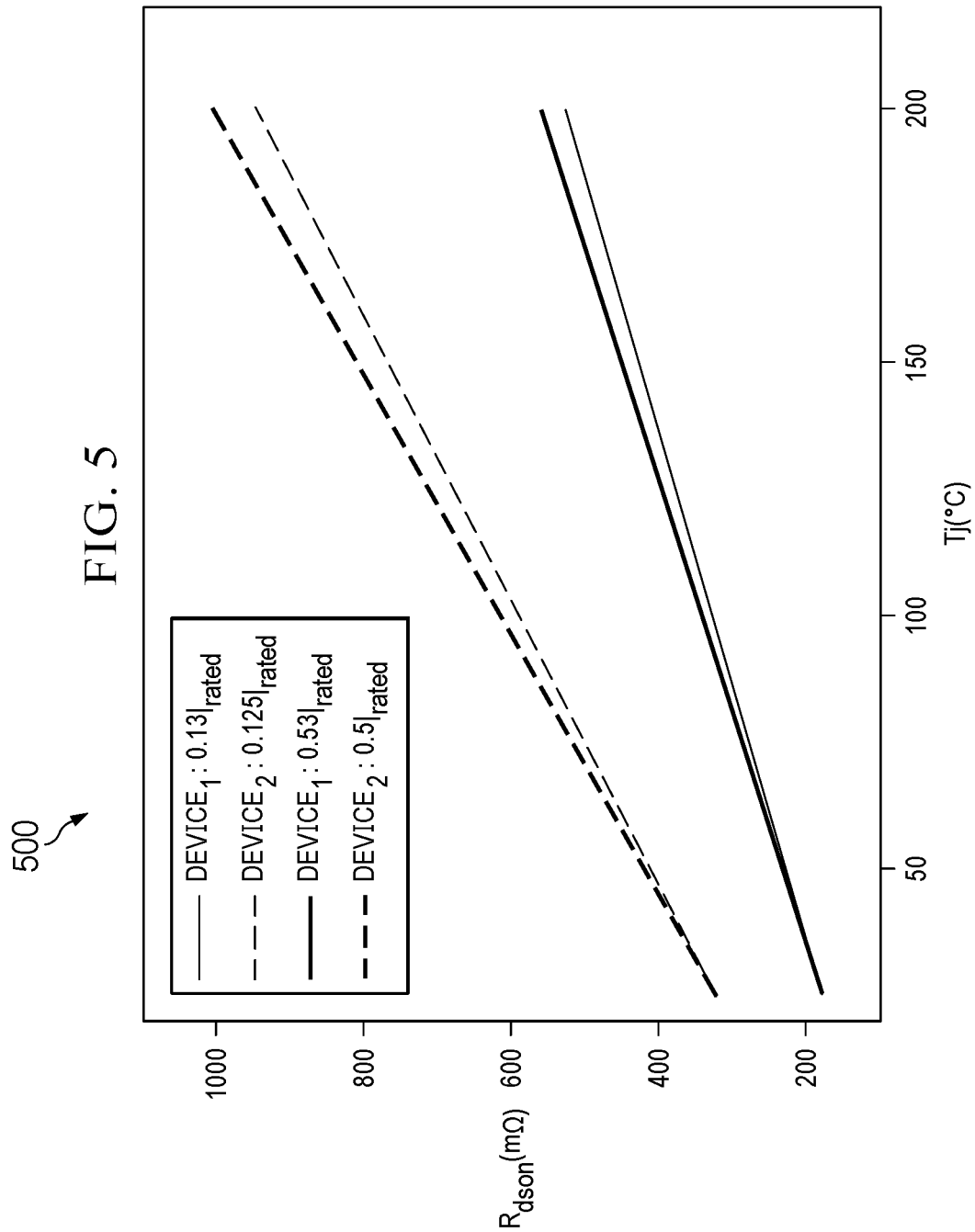
FIG. 5 is a diagram of test measurements, in accordance with an example embodiment of the present disclosure.

FIG. 5 is a diagram 500 of test measurements, in accordance with an example embodiment of the present disclosure. In order to properly estimate the degradation of a GaN FET, measurement and estimation of junction temperature ($T_j$) is important. To avoid wrong temperature or $R_{ds\text{-}on}$ sensing, the thermal cycling can be carried out at a slower rate, and fast $V_{ds\text{-}on}$ measurement can be utilized. The cycling process can be accelerated with a higher current, but can result in unexpected failures if the wrong estimate for $T_j$ is used. A novel method is disclosed that utilizes the value of $R_{ds\text{-}on}$ based junction temperature, which can achieve faster degradation. $R_{ds\text{-}on}$ is not only a good indicator of the junction temperature for GaN device, but can also avoid unwanted device failure due to thermal runaway.

Figure 6:
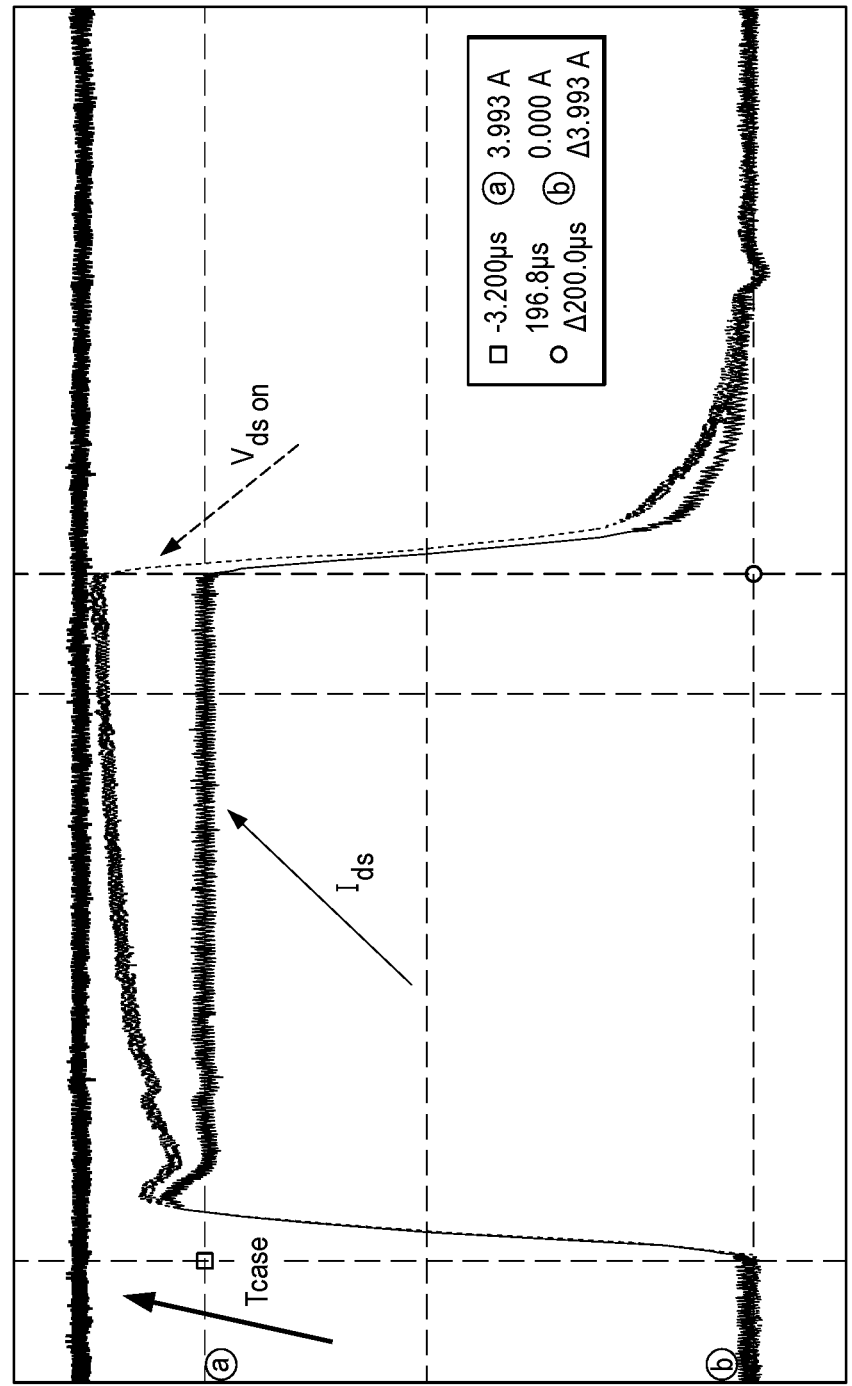
FIG. 6 is a diagram 600 of $R_{ds\text{-}on}$ versus junction-temperature ($T_j$) of two GaN FET devices, in accordance with an example embodiment of the present disclosure.

FIG. 6 is a diagram 600 of $R_{ds\text{-}on}$ versus junction-temperature ($T_j$) of two GaN FET devices, in accordance with an example embodiment of the present disclosure. The $R_{ds\text{-}on}$ of the device can be obtained by dividing the on-state voltage ($V_{ds\text{-}on}$) of the device by its drain current (ID). The $R_{ds\text{-}on}$ has been found as the lifetime or health precursor for the GaN FET devices. Hence the measurement of $R_{ds\text{-}on}$ can to be tracked during the thermal cycling during the aging process. The on-state-resistance of the GaN FET device changes with the junction temperature. Diagram 600 shows the $R_{ds\text{-}on}$ vs junction-temperature ($T_j$) of two GaN FET devices at two current values obtained by soaking the device in a thermal chamber. It shows a unique relationship between $R_{ds\text{-}on}$ and $T_j$. Hence $T_j$ can be indirectly estimated by measuring the on-state resistance of the device. Diagram 600 shows that $R_{ds\text{-}on}$ of a device varies with the current passing through the device. As such, the curve of $R_{ds\text{-}on}$ versus $T_j$ can be obtained for different current values before starting the thermal cycling process using $R_{ds\text{-}on}$-based-$T_j$-estimation. If instead of thermal-limit, an 'adjusted $R_{ds\text{-}on}$-limit' method is used for thermal cycling of GaN FETs, the thermal runaway issues can be solved when characterizing the FETs. This procedure can be extended to other suitable types of FETs, including SiC, Si, and other suitable materials.

As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. As used herein, phrases such as "between X and Y" and "between about X and Y" should be interpreted to include X and Y. As used herein, phrases such as "between about X and Y" mean "between about X and about Y." As used herein, phrases such as "from about X to Y" mean "from about X to about Y."

As used herein, "hardware" can include a combination of discrete components, an integrated circuit, an application-specific integrated circuit, a field programmable gate array, or other suitable hardware. As used herein, "software" can include one or more objects, agents, threads, lines of code, subroutines, separate software applications, two or more lines of code or other suitable software structures operating in two or more software applications, on one or more processors (where a processor includes one or more microcomputers or other suitable data processing units, memory devices, input-output devices, displays, data input devices such as a keyboard or a mouse, peripherals such as printers and speakers, associated drivers, control cards, power sources, network devices, docking station devices, or other suitable devices operating under control of software systems in conjunction with the processor or other devices), or other suitable software structures. In one exemplary embodiment, software can include one or more lines of code or other suitable software structures operating in a general purpose software application, such as an operating system, and one or more lines of code or other suitable software structures operating in a specific purpose software application. As used herein, the term "couple" and its cognate terms, such as "couples" and "coupled," can include a physical connection (such as a copper conductor), a virtual connection (such as through randomly assigned memory locations of a data memory device), a logical connection (such as through logical gates of a semiconducting device), other suitable connections, or a suitable combination of such connections. The term "data" can refer to a suitable structure for using, conveying or storing data, such as a data field, a data buffer, a data message having the data value and sender/receiver address data, a control message having the data value and one or more operators that cause the receiving system or component to perform a function using the data, or other suitable hardware or software components for the electronic processing of data.

In general, a software system is a system that operates on a processor to perform predetermined functions in response to predetermined data fields. A software system is typically created as an algorithmic source code by a human programmer, and the source code algorithm is then compiled into a machine language algorithm with the source code algorithm functions, and linked to the specific input/output devices, dynamic link libraries and other specific hardware and software components of a processor, which converts the processor from a general purpose processor into a specific purpose processor. This well-known process for implementing an algorithm using a processor should require no explanation for one of even rudimentary skill in the art. For example, a system can be defined by the function it performs and the data fields that it performs the function on. As used herein, a NAME system, where NAME is typically the name of the general function that is performed by the system, refers to a software system that is configured to operate on a processor and to perform the disclosed function on the disclosed data fields. A system can receive one or more data inputs, such as data fields, user-entered data, control data in response to a user prompt or other suitable data, and can determine an action to take based on an algorithm, such as to proceed to a next algorithmic step if data is received, to repeat a prompt if data is not received, to perform a mathematical operation on two data fields, to sort or display data fields or to perform other suitable well-known algorithmic functions. Unless a specific algorithm is disclosed, then any suitable algorithm that would be known to one of skill in the art for performing the function using the associated data fields is contemplated as falling within the scope of the disclosure. For example, a message system that generates a message that includes a sender address field, a recipient address field and a message field would encompass software operating on a processor that can obtain the sender address field, recipient address field and message field from a suitable system or device of the processor, such as a buffer device or buffer system, can assemble the sender address field, recipient address field and message field into a suitable electronic message format (such as an electronic mail message, a TCP/IP message or any other suitable message format that has a sender address field, a recipient address field and message field), and can transmit the electronic message using electronic messaging systems and devices of the processor over a communications medium, such as a network. One of ordinary skill in the art would be able to provide the specific coding for a specific application based on the foregoing disclosure, which is intended to set forth exemplary embodiments of the present disclosure, and not to provide a tutorial for someone having less than ordinary skill in the art, such as someone who is unfamiliar with programming or processors in a suitable programming language. A specific algorithm for performing a function can be provided in a flow chart form or in other suitable formats, where the data fields and associated functions can be set forth in an exemplary order of operations, where the order can be rearranged as suitable and is not intended to be limiting unless explicitly stated to be limiting.

It should be emphasized that the above-described embodiments are merely examples of possible implementations. Many variations and modifications may be made to the above-described embodiments without departing from the principles of the present disclosure. All such modifications and variations are intended to be included herein within the scope of this disclosure and protected by the following claims.

What is claimed is:

1. A system for monitoring elements of a heterogeneous or monolithic integrated circuit, comprising:
    a device under test of the integrated circuit coupled to a power source of the integrated circuit and a signal source of the integrated circuit and configured to generate a power output of the integrated circuit using the signal source;
    a current output of the integrated circuit;
    a voltage output of the integrated circuit; and
    a remaining useful life detector of the integrated circuit coupled to the current output and the voltage output and configured to generate a plurality of first impedances as a function of the current output and the voltage output, each of the first impedances associated with a frequency component of a series of frequencies, and compare each of the first impedances to each of a plurality of second impedances, each second impedance associated with each frequency component of a series of frequencies, and to generate an indicator if one of the first impedances exceed one or more of the second impedances.

2. The system of claim 1 wherein the device under test is a power field effect transistor.

3. The system of claim 1 wherein the device under test is a capacitor.

4. The system of claim 1 wherein the first impedances are calculated for a first frequency current component and a first frequency voltage component.

5. The system of claim 1 wherein the first impedances are calculated for a plurality of different frequency current components.

6. The system of claim 1 wherein the first impedances are calculated for a plurality of different frequency voltage components.

7. The system of claim 1 wherein the first impedances are calculated for a plurality of different frequency current components and a plurality of associated different frequency voltage components.

8. The system of claim 1 wherein the first impedances are calculated for a plurality of thermal cycles.

9. The system of claim 1 wherein the second impedances are calculated for a plurality of thermal cycles.

10. The system of claim 1 wherein the first impedances are calculated using a machine learning model.

11. A method for monitoring elements of a heterogeneous or monolithic integrated circuit, comprising:
    generating a power output for a device under test of the integrated circuit coupled to a power source of the integrated circuit and a signal source of the integrated circuit using the signal source;
    generating a plurality of first impedances of the device under test using an end of life detector of the integrated circuit, each of the first impedances associated with a frequency component of a series of frequencies;

comparing each of the first impedances to each of a plurality of second impedances, each second impedance associated with each frequency component of a series of frequencies; and generating an indicator if one or more of the first impedances exceed one or more of the second impedances.

12. The method of claim 11 wherein the device under test is a power field effect transistor.

13. The method of claim 11 wherein the device under test is a capacitor.

14. The method of claim 11 further comprising calculating the first impedances for a first frequency current component and a first frequency voltage component.

15. The method of claim 11 further comprising calculating the first impedances for a plurality of different frequency current components.

16. The method of claim 11 further comprising calculating the first impedances for a plurality of different frequency voltage components.

17. The method of claim 11 further comprising calculating the first impedances for a plurality of different frequency current components and a plurality of associated different frequency voltage components.

18. The method of claim 11 further comprising calculating the first impedances for a plurality of thermal cycles.

19. The method of claim 11 further comprising calculating the second impedances for a plurality of thermal cycles.

20. The method of claim 11 further comprising calculating the first impedances using a machine learning model.

* * * * *